United States Patent
Nakata et al.

(10) Patent No.: US 7,864,082 B2
(45) Date of Patent: Jan. 4, 2011

(54) VARIABLE LENGTH CODE DECODING DEVICE AND DECODING METHOD

(75) Inventors: Hiroaki Nakata, Yokohama (JP);
Fumitaka Izuhara, Kokubunji (JP);
Kazushi Akie, Kokubunji (JP);
Takafumi Yuasa, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 38 days.

(21) Appl. No.: 12/467,556

(22) Filed: May 18, 2009

(65) Prior Publication Data

US 2009/0237278 A1    Sep. 24, 2009

Related U.S. Application Data

(63) Continuation of application No. 11/845,850, filed on Aug. 28, 2007, now Pat. No. 7,535,386.

(30) Foreign Application Priority Data

Aug. 29, 2006  (JP)  .............................. 2006-231882

(51) Int. Cl.
*H03M 7/40* (2006.01)
(52) U.S. Cl. .......................................... 341/67; 341/65
(58) Field of Classification Search .................. 341/67, 341/65, 63; 375/240.23; 382/246
See application file for complete search history.

(56) References Cited

U.S. PATENT DOCUMENTS

| 5,398,027 | A   | 3/1995  | Ooi |
| 6,738,525 | B1  | 5/2004  | Iwata |
| 7,148,820 | B2  | 12/2006 | Sakai et al. |
| 7,348,902 | B2* | 3/2008  | Pisarevsky et al. ............ 341/67 |

FOREIGN PATENT DOCUMENTS

JP    2003-309471    10/2003

\* cited by examiner

*Primary Examiner*—Joseph Lauture
(74) *Attorney, Agent, or Firm*—Antonelli, Terry, Stout & Kraus, LLP.

(57) ABSTRACT

A variable length code decoding device for decoding variable length code data, including: a table memory that stores a plurality of decoding process tables having a reference relationship therein; and a decoding control unit that is given a start address and an initial reference bit length of the table memory; and sequentially selects the decoding process tables according to the decoded data to control a process of decoding the variable length code data, wherein when referring to the decoding process table to perform an initial decoding of the variable length code data, the initial decoding process is conducted by a longer bit length to be clipped from the variable length code data for referring to the decoding process table than the bit length used when referring to the other portions of the decoding process table.

4 Claims, 9 Drawing Sheets

FIG.2

CODE TABLE

| CODE NUMBER | CODE WORD (VARIABLE LENGTH CODE) | CODE WORD BIT LENGTH |
|---|---|---|
| 0 | 00 | 2 |
| 1 | 11 | 2 |
| 2 | 10010 | 5 |
| 3 | 101 | 3 |
| 4 | 1000 | 4 |
| 5 | 10011 | 5 |
| 6 | 0110 | 4 |
| 7 | 0100 | 4 |
| 8 | 0111 | 4 |

FIG.3

TABLE A (TABLE FIRST LOOKED UP, REFER TO 2 BITS)

| OFFSET ADDRESS | CODE WORD | NEXT TABLE ADDRESS | NEXT TABLE REFERENCE BIT LENGTH | SIGNIFICANT BIT LENGTH | DECODED VALUE |
|---|---|---|---|---|---|
| 0 | 00 | - | - | 2 | 0 |
| 1 | 01 | TABLE B | 2 | - | - |
| 2 | 10 | TABLE C | 2 | - | - |
| 3 | 11 | - | - | 2 | 1 |

FIG.4

TABLE B (REFER TO 2 BITS)

| OFFSET ADDRESS | CODE WORD | NEXT TABLE ADDRESS | NEXT TABLE REFERENCE BIT LENGTH | SIGNIFICANT BIT LENGTH | DECODED VALUE |
|---|---|---|---|---|---|
| 0 | 00 | - | - | 2 | 7 |
| 1 | 01 | - | - | 0 | 0 |
| 2 | 10 | - | - | 2 | 6 |
| 3 | 11 | - | - | 2 | 8 |

FIG. 5

TABLE C (REFER TO 2 BITS)

| OFFSET ADDRESS | CODE WORD | NEXT TABLE ADDRESS | NEXT TABLE REFERENCE BIT LENGTH | SIGNIFICANT BIT LENGTH | DECODED VALUE |
|---|---|---|---|---|---|
| 0 | 00 | - | - | 2 | 4 |
| 1 | 01 | TABLE D | 1 | - | - |
| 2 | 10 | - | - | 1 | 3 |
| 3 | 11 | - | - | 1 | 3 |

FIG. 6

TABLE D (REFER TO 1 BIT)

| OFFSET ADDRESS | CODE WORD | NEXT TABLE ADDRESS | NEXT TABLE REFERENCE BIT LENGTH | SIGNIFICANT BIT LENGTH | DECODED VALUE |
|---|---|---|---|---|---|
| 0 | 0 | - | - | 1 | 2 |
| 1 | 1 | - | - | 1 | 5 |

FIG. 8

START ADDRESS

MEMORY AREA OF
TABLE A
(4 ENTRIES) — 410

START ADDRESS
+ 8 BYTES

MEMORY AREA OF
TABLE B
(4 ENTRIES) — 420

START ADDRESS
+ 16 BYTES

MEMORY AREA OF
TABLE C
(4 ENTRIES) — 430

START ADDRESS
+ 24 BYTES

MEMORY AREA OF
TABLE D
(2 ENTRIES) — 440

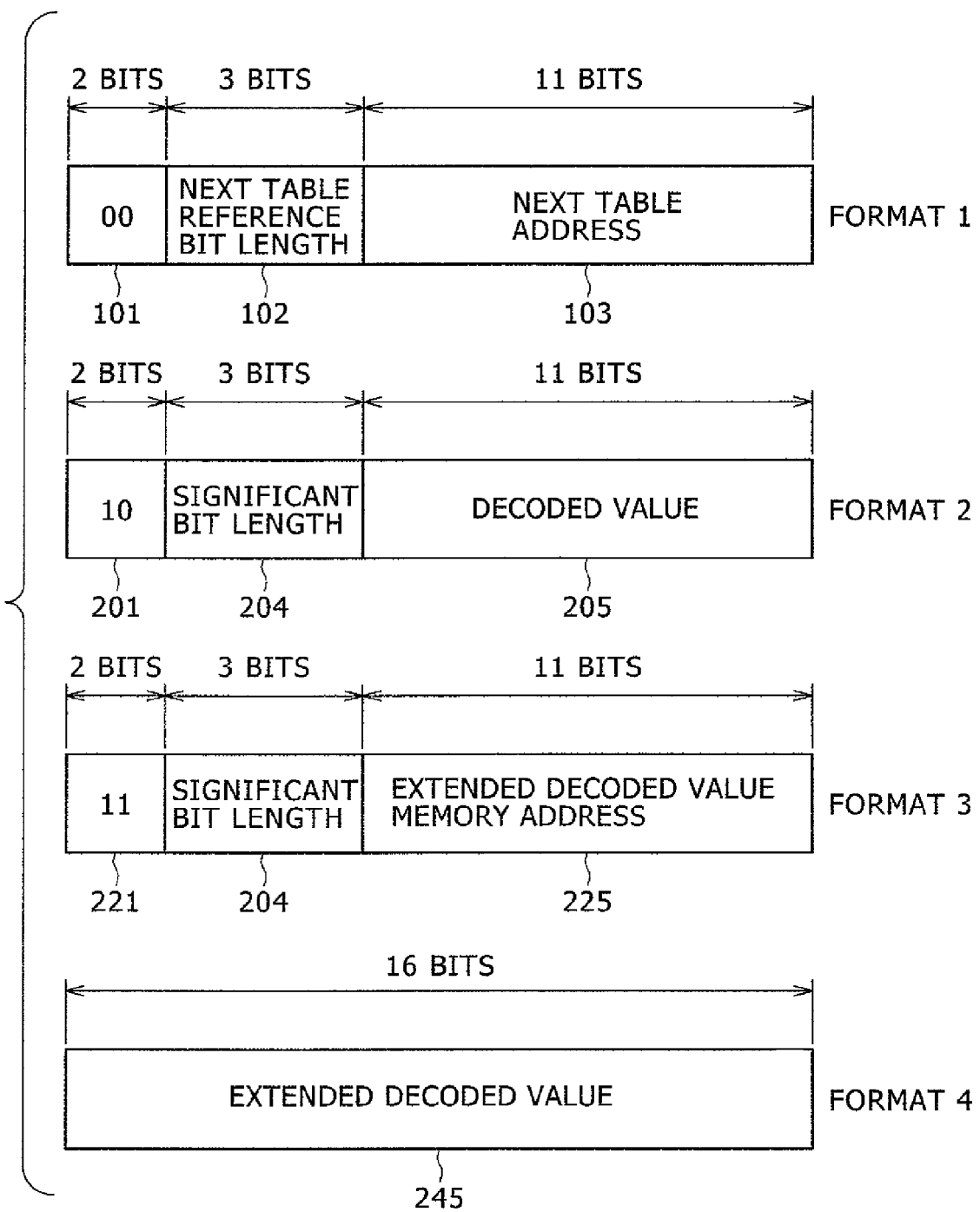

VARIABLE LENGTH CODE DECODING DEVICE AND DECODING METHOD

CROSS REFERENCE TO RELATED APPLICATION

This is a continuation of U.S. application Ser. No. 11/845,850, filed Aug. 28, 2007 now U.S. Pat. No. 7,535,386. This application relates to and claims priority from Japanese Patent Application No. 2006-231882, filed on Aug. 29, 2006. The entirety of the contents and subject matter of all of the above is incorporated herein by reference.

BACKGROUND OF THE INVENTION

The present invention relates to a device for decoding a variable length code, and more particularly to a variable length code decoding device that is capable of suppressing a table memory size which is used in decoding compressed data by the aid of a variable length code.

Japanese Patent Application Laid-Open Publication No. 2003-309471 discloses a method in a related art of the present invention. In Japanese Patent Application Laid-Open Publication No. 2003-309471, attention is paid to a common bit of variable length code words when referring to a table for decoding, and bits that are brought from the variable length codes and referred to are limited to a certain bit length (m bits) in one decoding process table reference. In a code word that is made up of m bits or more, only the common bit portion at an MSB side is processed once so as to reduce one decoding process table size down to $2^m$ entries which are the number of entries corresponding to m bits. In a portion of the code word subsequent to the common bit, another decoding process table corresponding to a portion after the common bit is referred to, and the decoding process is continued to complete the decoding operation. In this situation, even in second and subsequent decoding process table references, when the code word portion used for the table reference, that is, a portion after the bit that is dealt with as the common bit in the previous table reference is equal to or larger than m bits, the subsequent table reference is repeated at a portion of the code word portion from which the common bit at the MSB side is removed to complete the decoding process.

SUMMARY OF THE INVENTION

However, in the method disclosed in Japanese Patent Application Laid-Open Publication No. 2003-309471, there is required that attention is paid to the common bit of the code word which is made up of m bits or more in the respective decoding process table references, and the table used in the portion after the common bit, that is, the decoding process table used in the subsequent reference is uniquely determined. Accordingly, it is necessary to uniquely determine the common bit at the MSB side with respect to all of the code words that are equal to or more than m bits and constitute the code table. When hardware in which m is determined is used, the structure of the code table where the common bit at the MSB side does not fall within the m bits cannot deal with the decoding process. In other words, with the structure of the code table, the minimum value that can be used by m, which obstructs a reduction in the number of entries of the decoding process table.

In the method disclosed in Japanese Patent Application Laid-Open Publication No. 2003-309471, because the subsequent decoding process table from the portion after the common bit is referred to, when the common bit portion is shorter than the bit length used in the table reference, a bit length of that difference is also used in the subsequent table reference. That is, because that difference bit length is referred to by plural times, the extra decoding process table entries are required as much.

As a tendency of the table used in the decoding, there exists such a trade off that a total of the size of the table required for decoding becomes smaller as the clipped bit length is shorter, but the number of looking up the table is increased, and the signal processing is delayed. However, in the method disclosed in Japanese Patent Application Laid-Open Publication No. 2003-309471, the same bit length is always clipped from the code word and the table is referred to in the table that is first referred to as well as the table that is subsequently referred to. Therefore, it is impossible to adjust the clipped bit length taking the trade off into consideration.

Under the circumstances, an object of the present invention is to provide a variable length code decoding device which is capable of adjusting the bit length that is referred to from the code word in one decoding process table lookup not depending on the common bit portion of the code table, suppressing plural references of the bit that is clipped from the code word in the decoding process to suppress the undesired entry included in the table necessary for the decoding, and adjusting the trade off the size of the table and the coding rate which are required for decoding.

In structuring the decoding process table, a flag of 1 bit indicating whether the decoding process is completed or continued is disposed in the respective entries of the table. The decoded value and the significant bit length are recorded in the entry of the decoding completion. Information that identifies the decoding process table used in the subsequent processing and the bit length that is clipped from the code word which is used when referring to the subsequent table are recorded in the entry of the continuation of the decoding process. When the decoding process starts, that is, when the initial table is referred to, the information for identifying the table to be used and the bit length to be referred to from the MSB side of the code work in referring to the table are designated together with the code word.

In the decoding process, when the entry of the table is the processing continuation entry, the bit that has been already referred to is read from the code word, and a table to be subsequently referred to is selected on the basis of the contents of the entry. Then, when the subsequent table is referred to, the bit length that is referred to from the code word is determined. The same processing is repeated in the subsequent table. When the entry of the table becomes the processing completion entry, the decoded value is obtained from the contents of the entry.

According to the present invention, it is possible to adjust the tradeoff of the processing performance and the size of the table required for decoding, and the processing performance can be effectively improved with respect to the total size of the table used for decoding.

BRIEF DESCRIPTION OF THE DRAWINGS

These and other features, objects and advantages of the present invention will become more apparent from the following description when taken in conjunction with the accompanying drawings wherein:

FIG. 2 is a diagram showing a code table according to the first embodiment of the present invention;

FIG. 3 is a first table of an example of set of the decoding process table corresponding to a variable length code table shown in FIG. 2;

FIG. 4 is a second table of an example of set of the decoding process table corresponding to the variable length code table shown in FIG. 2;

FIG. 5 is a third table of an example of set of the decoding process table corresponding to the variable length code table shown in FIG. 2;

FIG. 6 is a fourth table of an example of set of the decoding process table corresponding to the variable length code table shown in FIG. 2;

FIG. 8 is a diagram showing an example in which the tables shown in FIGS. 3 to 6 are stored in the memory;

FIG. 10 is a diagram showing an example of a format of data which is stored in the entry of the decoding process table according to a second embodiment of the present invention.

DESCRIPTION OF THE PREFERRED EMBODIMENTS

Now, a description will be given of embodiments of the present invention with reference to the accompanying drawings.

First Embodiment

Figure 1:
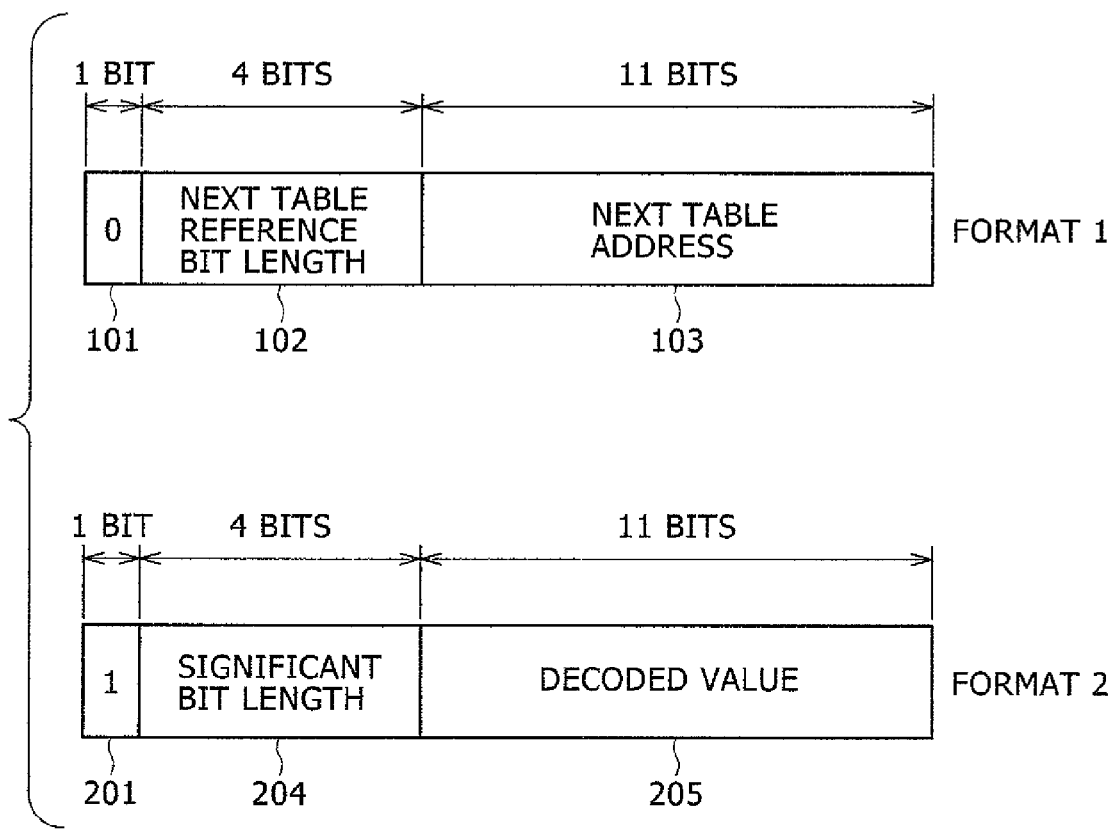
FIG. 1 is a diagram showing an example of a format of data that is stored in an entry of a decoding process table according to a first embodiment of the present invention.

According to the present invention, in decoding a variable length code corresponding to a certain code table, there are used plural decoding process tables which are made up of entries in which the data of a format shown in FIG. 1 is stored, and the decoding process tables are sequentially referred to, thereby conducting a decoding process. However, only one decoding process table may be required. A description will be first given of a structural example of a data format which is stored in the entry of the table which is a main feature of the present invention, and a method of producing the decoding device table corresponding to the code table will be described later. In FIG. 1, it is assumed that the entry of the table is 16 bits, but the bit width can be changed depending on the implementation.

As shown in FIG. 1, there are two kinds of data that is stored in the entry of the table, that is, a format 1 and a format 2. It is possible to discriminate which format is used according to the MSB of the stored data. That is, when MSB is 0 (101), the format 1 is used, and when MSB is 1 (201), the format 2 is used. In order to identify the format, it is possible to allocate the bit other than MSB, and it is possible to allocate a portion of 2 or more bits as the occasion demands.

The format 1 is a data format indicative of the variable length code decoding process continuation, which is made up of a subsequent table reference bit length 102 and a subsequent table address 103. In the present invention, since it is necessary to sequentially refer to the decoding process table, the table that is subsequently referred to is discriminated by the aid of the subsequent table address 103. The subsequent table address 103 is an address on a memory in which the table that is subsequently referred to is stored. The address is a relative address from the address immediately after a memory area in which the decoding process table to be now referred to has been stored. There is also proposed an installation using the address immediately after that memory area, or an installation using the relative address from the entry in which the subsequent table address is stored. In the data format shown in FIG. 1, since one entry assumes 16 bits, an address obtained by shifting an address of the 16-bits unit, that is, an address of the byte unit to the right by one bit is stored, and one bit of the LSB of the address is saved. Alternatively, there is proposed an installation that stores the address of the byte unit.

It is possible to conduct the installation using an index number which is capable of identifying the subsequent table instead of the subsequent table address 103. When a table that specifies the location of the table according to the index number is additionally prepared, it is possible to specify the subsequent table according to the index number. That is, when the subsequent table address 103 is capable of specifying the table that is subsequently referred to, the additional table can be replaced by the subsequent table address 103.

The subsequent table reference bit length 102 is a portion indicating that some bits are clipped from the variable length code to refer to the table at the time of referring to the subsequent table. That is, when the field is 1, 1 bit is clipped from the variable length code, and used in referring to the subsequent table. When the field is 2, 2 bits are clipped for the same purpose. In this way, the bit length that is clipped from the variable length code is specified. When this bit length is n, the subsequent table is constituted by the $2^n$ entries.

The format 2 is a data format indicative of the variable length code decoding completion, and made up of a significant bit length 204 and a decoded value 205. The decoded value 205 is a portion that stores the decoded value of the variable length code therein. The code number is normally stored as the decoded value, but in the case where the code number is further converted into another value through table look up processing, a case in which a final result is stored is also proposed.

The significant bit length 204 is indicative of a bit length which is actually clipped from the variable length code in presently looking up the table. In referring to the decoding process table, the bit length that is clipped from the variable length code at the time of referring to the table is designated from the previous table lookup result or the parameter at the time of starting the decoding process. However, because the length of the final portion of the variable length code does not always coincide with the bit length that is clipped when looking up the table, there is required information on the significant bit length 204 in order to specify a terminal of the variable length code which is now being decoded. Because the significant bit length 204 is unnecessary in the format 1 corresponding to the table reference other than the terminal portion of the variable length code, the significant bit length 204 does not exist in the format 1.

The significant bit length 204 is also applicable in the bit pattern detection when the bit pattern cannot exist. The bit pattern that is not allocated as the variable length code can exist depending on the configuration of the variable length code. In order to detect the above abnormal bit pattern, 0 is registered in the significant bit length 204 in the data of the entry where it is decided that there is the abnormal bit pattern. Since the significant bit length 204 is always equal to or larger than 1 in the case where the significant bit length 204 can be normally decoded, the abnormality can be detected by detecting that the significant bit length 204 is 0.

FIG. 2 shows an example of the code table, and a description will be given of a method of producing a set of the decoding process table which is configured by the entry that stores the data of the format shown in FIG. 1 corresponding to FIG. 2 therein. A structural example of the set of the decoding process table corresponding to the variable length code table shown in FIG. 2 is shown in FIGS. 3 to 6. In the present invention, plural tables, that is, the table set is normally required in the decoding process, and the entire drawings shown in FIGS. 3 to 6 correspond to an example of the set of the decoding process table.

Because the respective entries of the tables shown in FIGS. 3 to 6 are made up of the data of the format shown in FIG. 1, the respective entries are the combination of the subsequent table address 103 and the subsequent table reference bit length 102, or the combination of the significant bit length 204 and the decoded value 205.

The variable length code table shown in FIG. 2 represents a relationship of the code number, the code word (variable length code), and the code bit number. The process for decoding the variable length code is to obtain a corresponding code number from the code word. In the actual application, there is a case in which a converting process is again conducted on the basis of the code number, and in this case, there is proposed that a value resulting from converting the code number is directly obtained as the decoded value. The code bit length is indicative of the bit length that constitutes the code word.

In the tables A to D that constitute the sets of the decoding process tables shown in FIGS. 3 to 6, the code word corresponds to a part of the variable length code to be decoded. In the present invention, the variable length code is referred to part by part to advance the processing. The code words in the tables A to D correspond to bits of the portion that is referred to from the variable length code in referring to the respective tables.

In order to determine the entry that is referred to in the decoding process table reference, it is necessary to obtain the offset address of the entry. However, since the offset address is equivalent to a value resulting from regarding the bit portion that is referred to from the variable length code as a binary numeral, the offset address can be easily calculated. In the tables A to D, the offset address indicates what number of entry, and in the structure of 16 bits per one entry, one offset address corresponds to 2 bytes.

The decoding table used in the present invention from the variable length code table will be produced in the following procedure. First, it is determined by what bits the variable length code is referred to in the decoding process table in principle. The decoding process tables shown in FIGS. 3 to 6 correspond to a case in which the variable length code is referred to 2 bits by 2 bits. In the case of referring to n bits, the decoding process table is made up of 2" entries. For that reason, as the number of reference bits increases more, the number of tables that constitute the set of the table necessary for the decoding process is more decreased. However, since the size of the individual decoding process tables is increased exponentially, the size of the set of the tables is resultantly increased. However, when the number of reference bits is small, the number of times at which the decoding process table is sequentially referred to in decoding the variable length code that is long in the code word is increased, and the decoding process period of time is required. In addition, information for following the subsequent table, that is, information corresponding to the format 1 shown in FIG. 1 is increased, resulting in an increase in the size of the set of the table used in the decoding process. Under the circumstances, it is necessary to determine the reference bit length taking those situations into consideration, but it is preferable that the decoding process table is normally referred to by about 2 to 4 bits unit.

Upon determination of the bit length which is referred to in the decoding process table, the code word is sectioned by its bit length unit in the code table. The production of the decoding process table shown in FIGS. 3 to 6 corresponds to a case in which the variable length code is referred to 2 bits by 2 bits.

In the production of the table that is first referred to, attention is paid to first two bits from the MSB of the code word in the variable length code table shown in FIG. 2. In this case, a table having all the combination of 2 bits, that is, a table having the entries of 00, 01, 10, and 11 are prepared. This table is shown as Table A in FIG. 3.

According to the code table of FIG. 2, since 00 and 11 conclude the code word by 2 bits, the significant bit length 204 and the decoded value 205 are stored in the above entries in the format 2 shown in FIG. 1 in Table A. Both of the code words 00 and 11 are 2 in the bit length of the code word in the code table shown in FIG. 2, 2 is stored in the significant bit length 204. In the decoded value 205, 0 that is a code number corresponding to the code word 00 is stored in the entry of 00, and 1 that is a code number corresponding to the code word 11 is stored in the entry of 11. Since 01 and 10 do not conclude the code word in two bits, the subsequent table address 103 and the subsequent table reference bit sequence 102 are stored in the format 1 shown in FIG. 1 in the entry in Table A. 2 is designated in the subsequent table reference bit length 102 by referring to 2 bits from the code word at the time of referring to the subsequent table in the entries of 01 and 10. The name of the table that is referred to is written in the subsequent table address 103 since the subsequent table address 102 depends on how the table is stored in the memory.

When the MSB 2 bits of the code word that is referred to in Table A is 01, because a process of decoding the bit subsequent to those 2 bits is conducted, Table B is prepared as the decoding process table. The contents of Table B are shown in FIG. 4. Table B is a table for conducting the decoding process with reference to a third bit and a fourth bit counted from the MSB of the code word.

In Table B, attention is paid to 2 bits to conduct the processing, and therefore tables of all the combinations of 2 bits are produced. In the entries of 00, 10, and 11, Table B is referred to subsequent to Table A, to thereby conclude the code word. Therefore, the significant bit length 204 and the decoded value 205 are stored in the format 2 shown in FIG. 1. In this situation, because it is necessary to refer to the entire 2 bits to conclude the code word in the entries of 00, 10, and 11, 2 is stored in the significant bit length 204. Taking the reference bit in Table A into consideration, 7 that is a code number corresponding to the code word 0100 is stored in the entry of 00, and 8 corresponding to the code word 0111 is stored in the entry of 11, in the decoded value 205. Because the code word is not allocated to the entry of 01 in the code table of FIG. 2, 0 indicative of an error is stored in the significant bit length 204 in the format 2 shown in FIG. 1. Since the significant bit length 0 cannot be normally realized, the significant bit length 0 can be detected as the error later.

When the MSB 2 bits of the code word that is referred to in Table A are 10, Table C is prepared as the decoding process table in order to conduct the process of decoding the bit subsequent to two bits. The contents of Table C are shown in FIG. 5. Table C is a table for conducting the decoding process with reference to a third bit and a fourth bit counted from the MSB of the code word.

Similarly, in Table C, attention is paid to 2 bits to conduct the processing, and therefore tables of all the combinations of 2 bits are produced. In the entries of 00, 10, and 11, Table C is referred to subsequent to Table A, to thereby conclude the code word. Therefore, the significant bit length 204 and the decoded value 205 are stored in the format 2 shown in FIG. 1. In this situation, because it is necessary to refer to the entire 2 bits to conclude the code word in the entries of 00, 2 is stored in the significant bit length 204. A first one bit portion concludes the code word, and therefore 1 is stored in the entries 10 and 11. That is, the entries of 10 and 11 are entries corresponding to the same code word. The reason that two entries are used with respect to the same code word is because the second bit in the Table C reference is not the code word to be decoded but corresponds to the leading portion of the subsequent code word, and therefore both of 0 and 1 can be obtained according to the subsequent code word.

Taking the decoded value including the reference bit in Table A as with the Table B reference bit in Table A into consideration, 4 that is a code number corresponding to the code word 1000 is stored in the entry of 00, and 3 corresponding to the code word 101 is stored in the entries of 10 and 11.

Since the code word has not yet been concluded even with reference to Table A and Table C in the entry of 01 in Table C, the subsequent table address 103 and the subsequent table reference bit length 102 are stored in the format 1 shown in FIG. 1. 1 is designated in the subsequent table reference bit length 102. This is because the code word is always concluded within 1 bit in the subsequent table reference, and therefore the waste of the table occurs in the 2-bits reference. That is, because the reference bit length can be set in each of the decoding process tables, the reference bit length is changed to suppress the size of the decoding process table.

When the entry of 01 is referred to in Table C, because the process of decoding the bit subsequent to those 2 bits is conducted, Table D is prepared as the decoding process table. The contents of Table D are shown in FIG. 6. Table 5 is a table for conducting the decoding process with reference to a fifth bit counted from the MSB of the code word.

In Table D, attention is paid to 1 bit to conduct the processing, and therefore tables of all the combinations of 1 bit are produced. In the entries of 0 and 1, Table D is referred to subsequent to Tables A and C, to thereby conclude the code word. Therefore, the significant bit length 204 and the decoded value 205 are stored in the format 2 shown in FIG. 1. One bit is referred to from the code word together with the entries of 0 and 1, to thereby conclude the code word, and therefore 1 is stored in the significant bit length 204. Taking the decoded value 205 including the reference bits in Tables A and C into consideration, a code number 2 corresponding to the code word 10010 is stored in the entry of 0, and the code number 5 corresponding to the code word 10011 is stored in the entries of 1.

The specific variable length code table and the decoding process table corresponding to the variable length code table are described with reference to FIGS. 2 to 6. This method is capable of accepting an arbitrary variable length code which falls with a range where the code number can be stored in the decoded value 205. The decoding process table is generally produced as follows. It is first determined how many bits of the variable length code are referred to in a certain decoding process table, and when the variable length code is concluded with the bit that has been referred to in that table, the format 2 shown in FIG. 1 is registered. In this situation, when the variable length code is concluded with the bit that is shorter than the referred bit, all the combinations in the surplus bit portion are subjected to the same registration. When the variable length code is not concluded, the decoding process table that is subsequently referred to in each of the entries is newly allocated. The newly allocated table is produced in the same method as the first method while attention is paid to bit obtained by removing the already referred portion from the variable length code. This operation is recursively conducted to produce all the tables necessary for the decoding process.

In the individual decoding process tables, when the entry is selected from the table, the number of entries is determined according to the number of bits that are referred to from the variable length code. As has been described above, in the case of referring to n bits of the variable length code, because the decoding process table is made up of $2^n$ entries, the fact that an increase in n causes the size of the decoding process table to exponentially increase needs to be taken into consideration.

In the decoding process according to the present invention, it is possible to designate the bit length that is referred to from the variable length code in each of the individual decoding process tables. On the other hand, the variable length code is so designed as to increase the occurrence frequency of the generally shorter code length. In addition, the decoding process table corresponding to the MSB side of the variable length code is used each time in each of the decoding processes. Under the circumstances, there is also proposed a method in which the bit length that is referred to from the variable length code is increased in only the table corresponding to the MSB side of the variable length code, that is, the table that is first referred to.

Figure 7:
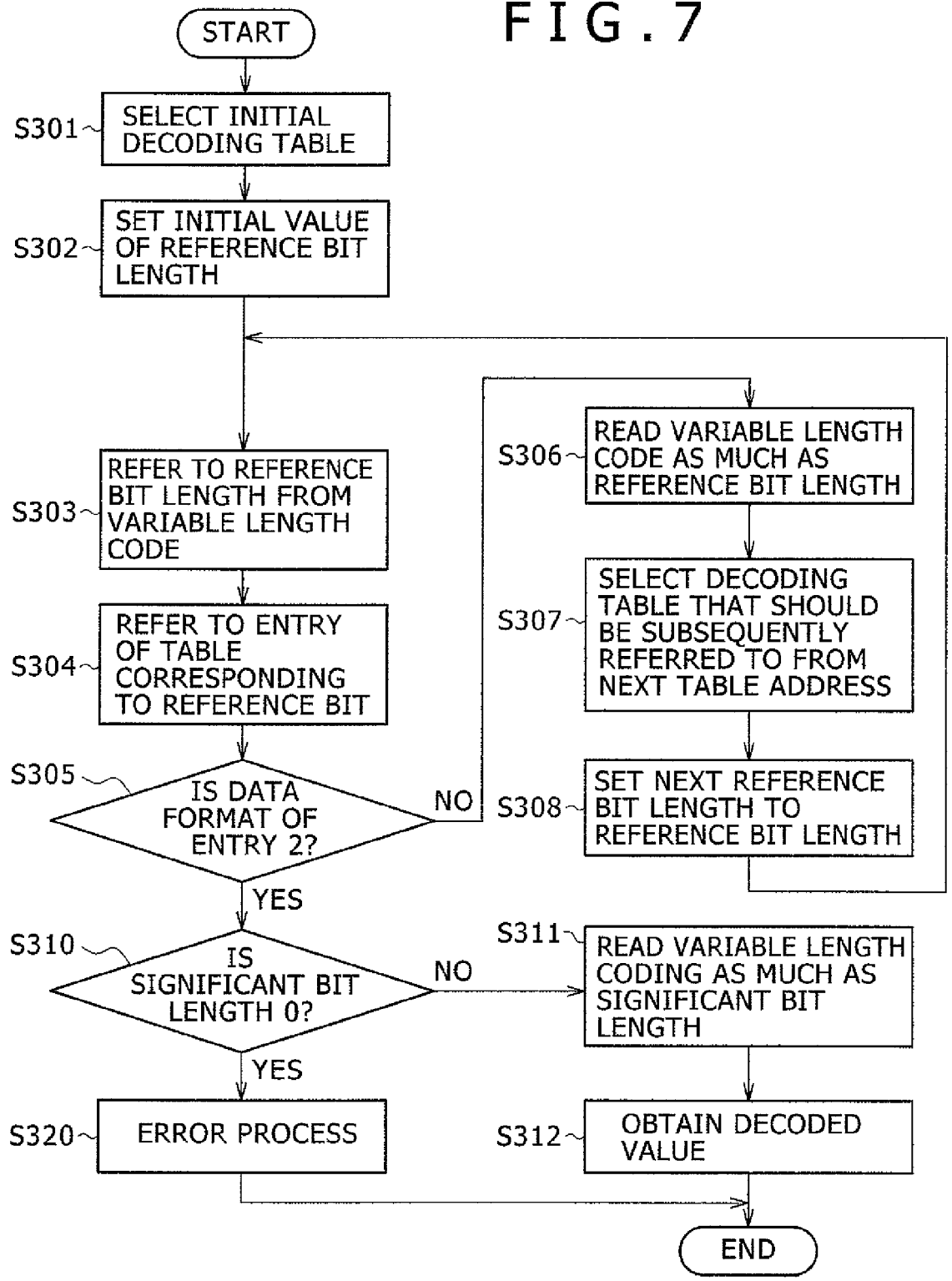
FIG. 7 is a flowchart showing a variable length decoding procedure.

A procedure of actually conducting the decoding process by the aid of the decoding process table is shown in FIG. 7. In conducting the decoding process, it is necessary to designate the decoding process table that is first used and designate the bit length that is referred to from the variable length code in referring to that table, in addition to the variable length code. In Step S301, an initial decoding process table is selected on the basis of the designations. In Step S302, an initial value of the reference bit length is set on the basis of the designations.

In Step S303, the reference bit length is clipped from the variable length code for the reference of the decoding process. At this time point, the operation of discarding the referred portion from the variable length code is not conducted. In Step S304, the entry that is selected by the reference bit which has been clipped in Step S303 is referred to from the decoding process table that is selected in Step S304. In Step S305, the format of the referred entry is confirmed, and when the format is not the format 2, the processing is shifted to Step S306.

In Step S306, the reference bit length is discarded from the variable length code. That is, a portion that is subsequently referred to is advanced as much as the reference bit length by the variable length code. In Steps S307 and S305, the decoding process table is changed over on the basis of the contents of the entry that is referred to in Step S305 to change the bit length that is referred to. Then, the processing is returned to Step S303 to repeat the processing.

When the format of the entry which is referred to in Step S305 is the format 2, the value of the significant bit length 204 of the entry is confirmed in Step S310. When the significant bit length 204 is 0, error processing is conducted in Step S320, to thereby complete the decoding process. When the significant bit length 204 is not 0, the variable length code is discarded as much as the bit length that is designated by the significant bit length 204 in Step S311, and prepared for the decoding process of the subsequent code word. Finally, in Step S312, the decoded value is obtained from the decoded value 205 which is stored in the entry.

An example in which the decoding process tables shown in FIGS. 3 to 6 are stored in the memory is shown in FIG. 8. In the example shown in FIG. 8, the memory is thickly filled with an area 410 of Table A to an area 440 of Table D in the stated order. It is possible to change the table storage order, or gaps can be defined between the respective tables. However, in this embodiment, since it is assumed that the subsequent table address 103 is a relative address, it is preferable that the tables are thickly arranged for the convenience of the bit length which is allocated to the subsequent table address 103. Also, since it is assumed that the subsequent table address 103 has no code, the table that is designated as the table that is subsequently referred to from a certain table always needs to be arranged at a rear address.

In this embodiment, when the tables are arranged as shown in FIG. 8, the subsequent table address 103 that is stored in the entry of the offset address in Table A shown in FIG. 3 becomes 0 since the memory area 420 of Table B exists immediately after the memory area 410 of Table A. The subsequent table address 103 that is stored in the entry of the offset address 2 shifts 8 to the right by 1 bit and becomes 4 because the memory area 430 of Table C exists ahead 8 bytes immediately after the memory area 410 of Table A. Likewise, the subsequent table address 103 that is stored in the entry of the offset address 1 in Table C shown in FIG. 5 becomes 0 since the memory area 440 of Table D exists immediately after the memory area 430 of Table C.

Figure 9:
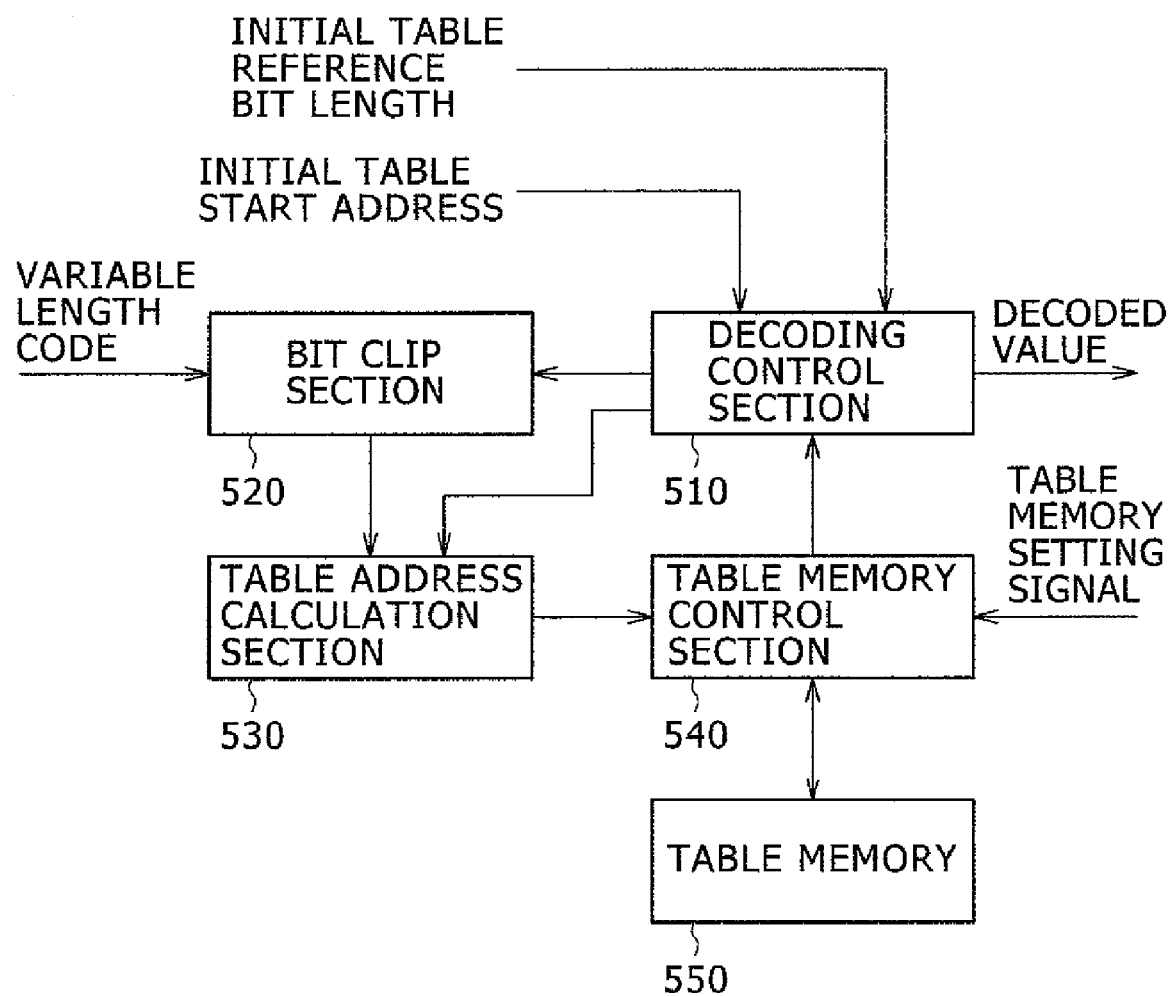
FIG. 9 is a diagram showing a structural example of a device that conducts the variable length decoding process.

FIG. 9 shows a structural example of the variable length code decoding device according to the present invention. In the structural example shown in FIG. 9, an initial table start address and an initial table reference bit length are input to the variable length code decoding device in addition to the variable length code. The initial table start address is used to specify the location of the decoding process table which is first referred to in conducting the decoding process. In the case where there are provided sets of the decoding process tables corresponding to plural kinds of code tables, it is possible to select which decoding process table is used by designation of the initial table start address. The initial table reference bit length is a bit length which is clipped from the code word and referred to in referring to the initial decoding process table. The table that is first referred to needs to be input from the external because the bit length that is referred to from the code word cannot be obtained from the interior of the decoding device.

A bit clip section 520 clips the bit that is used for the reference of the decoding process table, and discards a portion where the reference processing has been completed to conduct the shift processing. A table address section 530 calculates the address of the entry of the decoding process table on the basis of a start address of the decoding process table which is selected for the decoding process and the reference bit that is acquired from the bit clip section 520. A table memory control section 540 adjusts an access request to a table memory 550 from the table address calculation section 530 and a table memory setting signal from the external, and outputs data that has been read from the table memory 550 to a decoding control section 510. The table memory setting signal from the external is used in writing the decoding process table in the table memory 550. The table memory 550 is formed of a RAM, but when the table memory 550 deals with the decoding of a predetermined code table, a portion of the decoding process table corresponding to the coding table can be formed of a ROM.

The decoding control section 510 manages the entire decoding process, outputs a shift command to the bit clip section 520, and instructs the clip bit quantity that is used for the reference of the decoding process table. Also, the decoding control section 510 calculates the address of the subsequent decoding process table on the basis of the contents that are read from the table memory 550 through the table memory control section 540, that is, the contents of the entry of the decoding process table, updates the a start address of the decoding process table, and updates the clip bit quantity that is used for the table reference. In addition, the decoding control section 510 detects the decoding process completion in referring to the decoding process table, and outputs the decoded value.

Because the table memory 550 can be rewritten from the external by means of the table memory control section 540, the table memory 550 is rewritten according to the code table to be decoded so as to deal with plural kinds of code tables. Also, when the capacity of the table memory 550 is sufficient, it is possible to write all of the decoding process table sets corresponding to the plural decoding tables in the table memory 550 in advance so as to use the decoding process table sets. The decoding process table that is first used is selected according to an initial table start address.

With the structure shown in FIG. 9, it is possible to conduct the operation according to a flowchart shown in FIG. 7, and the variable length decoding device can be realized.

According to the present invention, plural decoding process tables are normally required with respect to a certain code table, but it is possible to designate the bit length that is referred to from the code word in each of the decoding process tables. Also, the reference processing number of the decoding process table is decreased more as the referred bit length is larger. Therefore, the average decoding rate when conducting the plural decoding processes is improved. In addition, because the occurrence frequency of the shorter code word is high in the variable length code, the longer bit is referred to in the decoding process table that is used at the time of referring to the bit of the first code word, to thereby effectively improve the decoding rate with respect to an increase in the size of the decoding process table set corresponding to a code table.

Furthermore, according to the present invention, the bit length that is referred to in each of the decoding process tables can be controlled independently of the variable length code allocation status. Therefore, the maximum referable number of the decoding process table is obtained taking the maximum processing time that is permissible for the decoding of one variable length code into consideration, and the decoding process table can be structured according to the maximum referable number.

Second Embodiment

A second embodiment of the present invention is directed to an example in which the data format that is stored in the decoding process entry which is used in the first embodiment is extended. The data format corresponding to the second embodiment is shown in FIG. 10. In the first embodiment, two kinds of data formats consisting of the format 1 and the format 2 are used. However, in the second embodiment, there are used four kinds of data formats consisting of a format 1 to a format 4.

The second embodiment is effective in a case where the decoded value does not fall within 11 bits with respect to the first embodiment. When the decoded value exceeds a range indicated by 11 bits, it is possible to deal with this case by using the format 3 and the format 4.

In order to extend the data format, 2 bits are allocated to the format identification bit in the second embodiment, and the subsequent table reference bit length 103 and the effective bit length 204 are made up of 3 bits, respectively.

In the second embodiment, the value of the format 1 identification bit is 00, and the value of the format 2 identification bit is 10. Also, 11 is allocated to the value of the format identification bit 3.

The format 4 is a format of data that is stored in a location that is indicated by an extension decoded value storage address 225 of the format 3. Accordingly, because the format can be identified although there is no format identification bit, there is no format identification bit.

The format 1 and the format 2 are used in the same manner as that in the first embodiment except that the allocation of the bit is different between the first embodiment and the second embodiment. The format 3 is used in the case where the decoded result does not fall within 11 bits, which cannot be dealt with by the format 2. When the format 3 is used, an address at which an extension decoded value 245 is stored is designated by the extension decoded value storage address 225.

The extension decoded value 245 is always stored in the format 4 at the address indicated by the extension decoded result storage address 225 of the format 3. Since the extension decoded result 245 is 16 bits, it is possible to store the decoded value that exceeds 11 bits.

That is, a table corresponding to the decoding process table shown in the first embodiment is prepared by the aid of the format 1, the format 2, or the format 3, and the decoded value is prepared in the format 4 at the address indicated by the format 3, separately.

The address that is designated by the extension decoded result storage address 225 is a relative address that starts at an address immediately after a portion made up of the format 1 to the format 3 in the decoding process table that is currently referred to. However, an absolute address can be designated according to the installation, or a relative address that starts at the entry where the extension decoded result storage address 225 is stored can be designated.

Because the format 4 is prepared separately from the portions that are made up of the format 1 to the format 3, it is possible to make the bit width of only the format 4 different from that of other formats such as the 32 bits width. That is, the format having the bit width larger than that of the format 4 is used in the installation as the occasion demands, thereby making it possible to deal with the decoded value whose range is wide.

What is claimed is:

1. A variable length code decoding device for decoding variable length code data, comprising:
   a table memory that stores a plurality of decoding process tables having a reference relationship therein; and
   a decoding control unit that is given a start address and an initial reference bit length of the table memory; and sequentially selects the decoding process tables according to the decoded data to control a process of decoding the variable length code data,
   wherein when referring to the decoding process table to perform an initial decoding of the variable length code data, the initial decoding process is conducted by a longer bit length to be clipped from the variable length code data for referring to the decoding process table than the bit length used when referring to the other portions of the decoding process table.

2. A variable length code decoding device for decoding variable length code data, comprising:
   a table memory that stores a plurality of decoding process tables having a reference relationship therein; and
   a decoding control unit that is given a start address and an initial reference bit length of the table memory, and sequentially selects the decoding process tables according to the decoded data to control a process of decoding the variable length code data,
   wherein information on a significant bit length is provided in the decoding process table which is used when decoding a bit sequence including at least a final portion for decoding of each of the variable length code data, and when the information indicating the bit length is a significant value, an error process is conducted.

3. A decoding method for a variable length code decoding device that decodes variable length code data, the method comprising:
   storing a plurality of decoding process tables having a reference relationship in a table memory; and
   giving a start address and an initial reference bit length of the table memory, and sequentially selecting the decoding process tables according to the decoded data to control a process of decoding the variable length code data by a decoding control unit,
   wherein when referring to the decoding process table to perform an initial decoding of the variable length code data, the initial decoding process is conducted by a longer bit length to be clipped from the variable length code data for referring to the decoding process table than the bit length used when referring to the other portions of the decoding process table.

4. A decoding method for a variable length code decoding device that decodes variable length code data, the method comprising:
   storing a plurality of decoding process tables having a reference relationship in a table memory; and
   giving a start address and an initial reference bit length of the table memory, and sequentially selecting the decoding process tables according to the decoded data to control a process of decoding the variable length code data by a decoding control unit,
   wherein information on a significant bit length is provided in the decoding process table which is used when decoding a bit sequence including at least a final portion for decoding of each of the variable length code data, and when the information indicating the bit length is a significant value, an error process is conducted.

* * * * *